United States Patent
Yuasa et al.

(10) Patent No.: US 6,380,051 B1
(45) Date of Patent: *Apr. 30, 2002

(54) LAYERED STRUCTURE INCLUDING A NITRIDE COMPOUND SEMICONDUCTOR FILM AND METHOD FOR MAKING THE SAME

(75) Inventors: Takayuki Yuasa, Nara-ken; Yoshihiro Ueta, Tenri, both of (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/337,404

(22) Filed: Jun. 21, 1999

(30) Foreign Application Priority Data

Jun. 24, 1998  (JP) ............................................. 10-176761

(51) Int. Cl.⁷ .......................... H01L 21/20; H01L 21/36
(52) U.S. Cl. ....................................... 438/481; 438/478
(58) Field of Search .............................. 438/22, 48, 93, 438/462, 478, 479, 480, 481, 482, 31; 257/96, 103, 76, 94, 93

(56) References Cited

U.S. PATENT DOCUMENTS 5,880,485 A * 3/1999 Marx et al. .................... 257/94
5,907,768 A * 5/1999 Malta et al. .................. 438/105
6,051,849 A * 4/2000 Davis et al. .................. 257/103
6,239,453 B1 * 5/2001 Yamasa et al. ............... 257/79

FOREIGN PATENT DOCUMENTS

| EP | 0688070 | * 12/1995 | ............. H01S/3/19 |
| EP | 0688070 A1 | * 12/1995 | ............. H01S/3/19 |
| JP | 05-343741 | 12/1993 | |

OTHER PUBLICATIONS

Thick GaN Epitaxial Growth with Low Dislocation Density by Hydride Vapor Phase Epitaxy, Usui, Sunakawa, Sakai and Yamaguchi, *Jpn. J. Appl. Phys.*, vol. 36 pp. 899–902 (1997).

* cited by examiner

*Primary Examiner*—Trung Dang
*Assistant Examiner*—Brook Kebede
(74) *Attorney, Agent, or Firm*—Renner, Otto, Boisselle & Sklar LLP

(57) ABSTRACT

A method for forming a nitride compound semiconductor film of the present invention includes the steps of: providing a substrate having a portion which acts as a growth suppressing film on a outermost surface thereof; forming a growth promoting film partially on the substrate; and forming a nitride compound semiconductor on the growth promoting film.

19 Claims, 6 Drawing Sheets

US 6,380,051 B1

LAYERED STRUCTURE INCLUDING A NITRIDE COMPOUND SEMICONDUCTOR FILM AND METHOD FOR MAKING THE SAME

BACKGROUND OF THE INVENTION

1. Field of the Invention

The present invention relates to a layered structure in which a nitride compound semiconductor film of an excellent quality can be obtained, and a method for forming the same.

2. Description of the Related Art

Conventionally, a nitride compound semiconductor has been employed and studied as a light-emitting diode and a device with a high-temperature resistance. By adjusting its composition, a nitride compound semiconductor can be employed as a light-emitting diode for a wide range of short wavelengths from blue to orange.

It has been known in the art that there is a need to reduce threading dislocation and cracks in a crystal for realizing a nitride compound semiconductor with excellent characteristics and a high reliability. As a conventional method for reducing the threading dislocation and cracks, the following method has been suggested (Jpn. J. Appl. Phys., Vol.36 (1997), pp. L899–L902). First, a thin film of GaN is epitaxially grown on a substrate by a metal organic chemical vapor deposition (MOCVD). After a striped selective growth mask of $SiO_2$ is formed on the substrate as a growth suppressing member, GaN is epitaxially grown on the wafer. According to this method, a flat epitaxial film is formed due to lateral crystal growth which occurs over the selective growth mask.

FIGS. 7A to 7D illustrate the steps of the above-mentioned method. A thin GaN film 702 with a thickness of about 0.5 $\mu$m to about 2 $\mu$m is deposited on a sapphire substrate 701 via a low-temperature buffer layer (not shown) of a GaAlN type material (FIG. 7A). Next, a $SiO_2$ film is formed on the thin GaN film 702, and patterned by a common photolithography technique so as to provide a striped $SiO_2$ selective growth mask 703 (width: about 5 $\mu$m, pitch: about 7 $\mu$m) (FIG. 7B).

Thereafter, a thick GaN film 704 with a thickness in the range of about 10 $\mu$m to about 300 $\mu$m is deposited by a hydride vapor phase epitaxy (HVPE) or MOCVD method. At the initial growth stage of the thick GaN film 704, the GaN crystal grows only in a window area 704 of the thin GaN film 702 on which no selective growth mask 703 is formed, as shown in FIG. 7C. At this stage, crystal deposition is locally suppressed by the selective growth mask 703, thereby selectively growing the crystal as shown in FIG. 7C. However, as the GaN crystal continues to grow, the GaN crystal on the window region 704 starts to laterally extend over the selective growth mask 703 (in this specification, this will be referred to as "lateral growth"). As a result, GaN crystals growing from adjacent window regions 704 attach to each other, thereby forming a thick GaN film 705 exhibiting a single layer structure (FIG. 7D).

Curve 201 in FIG. 2 illustrates density of threading dislocation on a wafer surface for various thicknesses (about 10 $\mu$m, about 50 $\mu$m, about 100 $\mu$m, and about 300 $\mu$m) of the thick GaN film 705 obtained by the conventional method. Threading dislocations are evenly distributed in all regions of the thick GaN film 705. The density is reduced as the thickness increases, and with the thick GaN film 705 having a thickness of about 100 $\mu$m or more, the density of threading dislocations is reduced to about $5 \times 10^7$ cm$^{-2}$. No crack is observed in the thick GaN film 705 irrespective of the thickness thereof.

However, the conventional method and the thick GaN film 705 obtained by the conventional method have the following problems.

(1) It is impossible to reduce the density of threading dislocation on the surface of the thick GaN film 705 to a density on the order of $10^6$ cm$^{-2}$ or less as needed for a device used with a large current density, such as a light-emitting diode and particularly a semiconductor laser device. Thus, if a GaN-type semiconductor laser device is formed on the wafer as shown in FIG. 7D, the operating life of the device will be as short as about 400 hours (under conditions of 60° C. and 5 mW), failing to realize the commercially required operating life of about 5000 hours.

(2) The manufacturing method is tedious because it is necessary to perform two epitaxial growth steps for the thin GaN film 702 and for the thick GaN film 705.

SUMMARY OF THE INVENTION

According to one aspect of this invention, a method for forming a nitride compound semiconductor film includes the steps of: (1) providing a substrate having a portion which acts as a growth suppressing film on a outermost surface thereof; (2) forming a growth promoting film partially on the substrate; and (3) forming a nitride compound semiconductor on the growth promoting film.

In one embodiment of the invention, the growth suppressing film is an amorphous film.

In another embodiment of the invention, the substrate is a crystal substrate of a cubic crystal structure having a surface along a (110) orientation or a (110) orientation.

In still another embodiment of the invention, the growth promoting film is ZnO or $In_sGa_wAl_{1-s-w}N$ ($0 \leq s \leq 1$, $0 \leq w \leq 1$, and $0 \leq s+w \leq 1$).

In yet another embodiment of the invention, a thickness of the growth promoting film is equal or greater than about 0.2 $\mu$m.

In another embodiment of the invention, the growth promoting film is in a form of a plurality of stripes separated from one another by an interval of about 20 $\mu$m or less.

According to another aspect of the present invention, a nitride compound semiconductor light-emitting diode includes: a substrate having a portion which acts as a growth suppressing film on a top surface thereof; a growth promoting film formed partially on the substrate; and a nitride compound semiconductor layered structure including a light-emitting layer formed on the substrate, the light-emitting layer having a light-emitting region into which an electric current injected. The light-emitting region is formed above a region of the substrate where no growth promoting film is formed.

Thus, the invention described herein makes possible the advantages of (1) providing a convenient method for forming a GaN-type semiconductor layer with a low density of threading dislocations, and (2) improving the operating life of a semiconductor laser device.

These and other advantages of the present invention will become apparent to those skilled in the art upon reading and understanding the following detailed description with reference to the accompanying figures.

DESCRIPTION OF THE PREFERRED EMBODIMENTS

Figure 1A:
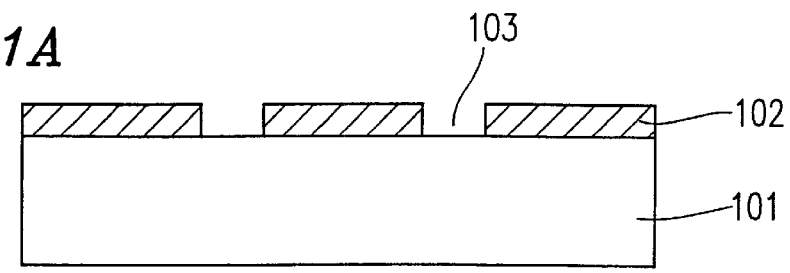
FIGS. 1A to 1D illustrate a method for forming a nitride compound semiconductor film according to Example 1 of the present invention.

First, the basic concept of the present invention will be described.

In the present invention, a growth promoting film is partially formed on a substrate having a portion which acts as a growth suppressing film on a surface thereof, and a nitride compound semiconductor film of a single crystal is grown thereon. As a method for growing the crystal, any commonly-used epitaxial growth method can be used, such as metal organic chemical vapor deposition (MOCVD), hydride vapor phase epitaxy(HVPE), molecule beam epitaxial (MBE), and the like.

The term "growth suppressing film" as used herein refers to a film on which the initial epitaxial growth of a nitride compound semiconductor occurs with difficulty, in other words, a film on which a nuclear generation is hard to initiate. The term "growth promoting film" as used herein refers to a compound film on which the initial growth of a nitride compound is facilitated, in other words, a compound film on which nuclear generation easily occurs.

The growth suppressing film for a nitride compound semiconductor includes an amorphous film or a crystalline film of a cubic crystal structure having a (100) orientation or a (110) orientation. The crystal film of a cubic crystal structure having a (100) orientation or (110) orientation may be GaP, β-siC, GaAs, or $MgAl_2O_4$. The amorphous film may be a glass, an amorphous Si, $SiO_x$ (x=1–2), or $Si_2N_y$ (y=1–3). The growth promoting film for the nitride compound semiconductor may be ZnO, GaN, AlN, InN or a mixture thereof ($In_sGa_wAl_{1-s-w}N$: $0 \leq s \leq 1$, $0 \leq w \leq 1$, $0 \leq s+w \leq 1$).

According to the present invention, a nitride compound semiconductor is grown on a wafer including a growth suppressing film and a convex growth promoting film in the form of stripes each having a width of about 100 μm or less. Accordingly, a nitride compound semiconductor crystal is selectively grown on the growth promoting film. The nitride compound semiconductor crystal grows not only on the top surface of the growth promoting film, but also on the side surface thereof. Therefore, immediately after the growth starts, the nitride compound semiconductor crystal grows in a lateral direction (i.e., a direction parallel to the wafer surface) at a certain growth rate, whereby the lateral growth rate is substantially enhanced in comparison to that of the conventional method.

Accordingly, the nitride compound semiconductor crystals growing from adjacent stripes of the growth promoting film attach to each other into a single nitride compound semiconductor layer in a shorter growth time as compared with that of the conventional method (thus, a single nitride compound semiconductor layer having a smaller thickness than that achieved by the conventional method can be obtained). Because of the substantially enhanced lateral growth rate, it is possible to obtain a region having threading dislocation density on the order of about $10^6$ cm$^{-2}$ or less in the single nitride compound semiconductor layer where the crystal is grown in the lateral direction. Moreover, since the width of the growth promoting film is about 100 μm or less, even if the wafer temperature is lowered to room temperature after growing the nitride compound semiconductor crystal at a high temperature near 1000° C., heat distortion of the nitride compound semiconductor layer is small, thereby suppressing cracks therein.

When a semiconductor laser device is formed on the region of the nitride compound semiconductor layer with reduced threading dislocation (i.e., "the lateral growth region" or a region above the growth suppressing film), it is possible to realize a device which exhibits a operating life of about 5000 hours or more in a reliability test under the conditions of 60° C. and 5 mW.

FIGS. 1A to 1D illustrate one example of a method for forming a nitride compound semiconductor according to the present invention. First, selected regions of a substrate 101 which functions as a growth suppressing film for a nitride compound semiconductor are covered with a growth promoting film 102 for the nitride compound semiconductor (FIG. 1A). The selective covering process may be achieved by first covering the entire substrate surface with the growth promoting film 102 by chemical vapor deposition, and the like, and then partially etching the film 102 by a simple photolithography method. Alternatively, the selective covering process may be achieved by depositing or sputtering the growth promoting film 102 using a patterned mask.

Next, the substrate 101 partially covered with the growth promoting film 102 is introduced into an apparatus for growing a nitride compound semiconductor, and the crystal is grown under normal conditions. The method for growing the nitride compound semiconductor may be any nitride compound semiconductor growth method known in the art, such as MOCVD, MBE, HVPE, and the like. When a crystal is grown on the substrate 101 of the present invention, substantially no nitride compound semiconductor grows on a portion 103 of the substrate 101 where no growth promoting film 102 is formed, i.e., a portion where the substrate 101 made of the growth suppressing film is exposed, while the nitride compound semiconductor 104 starts to epitaxially grow on the growth promoting film 102. The nitride compound semiconductor 104 grows not only on the top surface of the growth promoting film 102, but also on a side surface thereof. As a result, the nitride compound semiconductor crystal starts to extend over the exposed portion of the growth promoting film 101 (FIG. 1B).

Figure 1B:
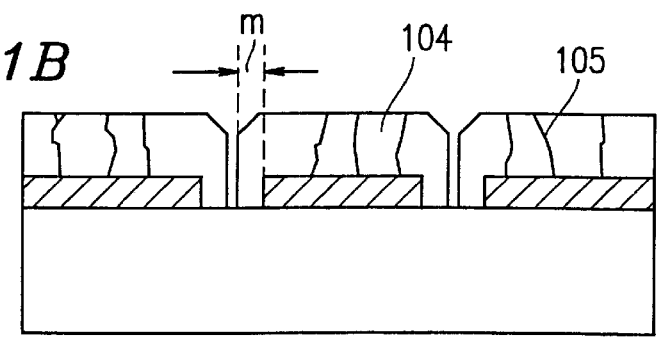
Figure 1C:
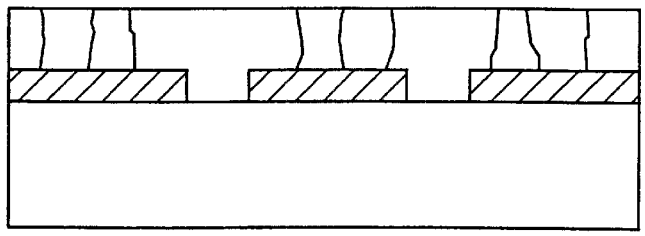
Figure 1D:
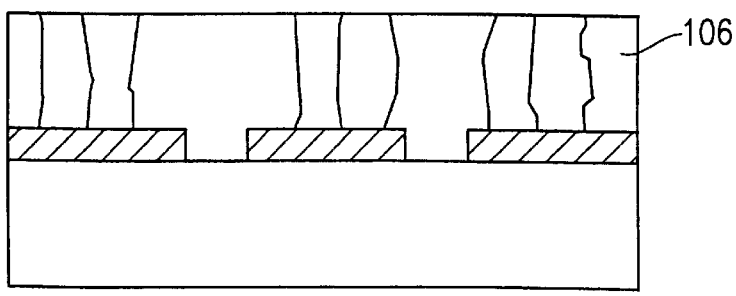

As the crystal continues to grow from a state shown in FIG. 1B, the nitride compound semiconductor crystal further grows in the thickness direction as well as in the lateral direction. As a result, the selectively grown nitride compound semiconductor crystals attach to each other (FIG. 1C). Thereafter, the semiconductor crystal only grows in the vertical direction, thereby forming a nitride compound semiconductor layer 106 having a flat surface. The threading dislocation density of the resultant nitride compound semiconductor layer 106 is smaller than that of the conventionally obtained layer by an order of magnitude or more.

Figure 7A:
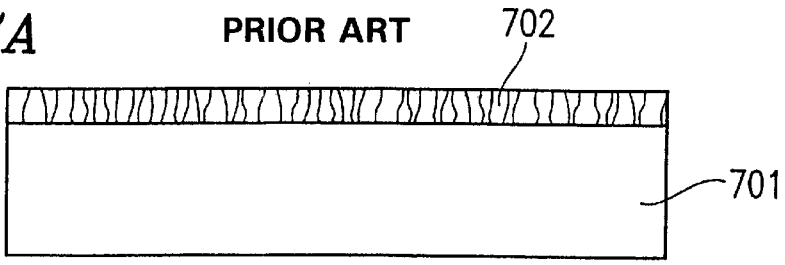
FIGS. 7A to 7D show one conventional method for forming a thick nitride compound semiconductor film.
Figure 7B:
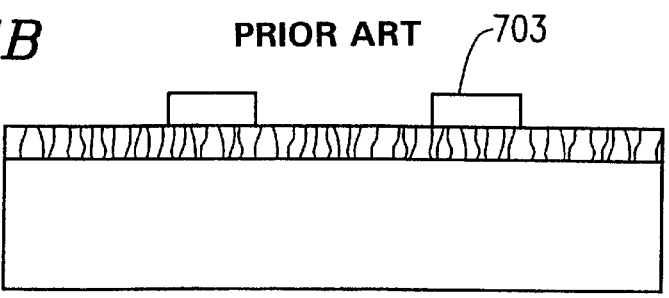
Figure 7C:
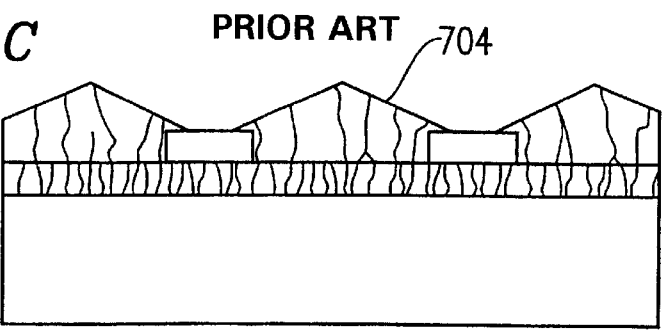
Figure 7D:
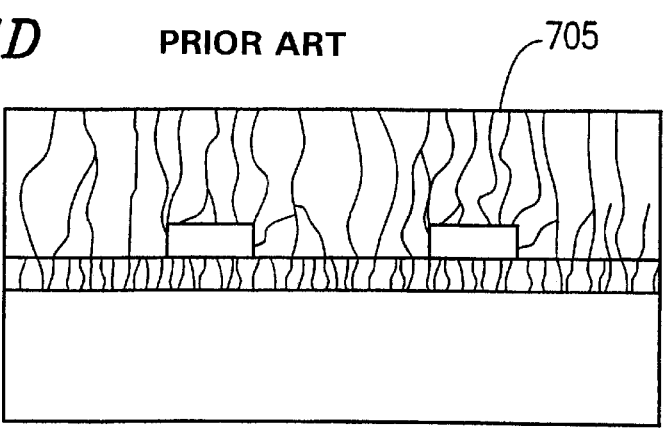

As described above, by applying the technique of the present invention, threading dislocations can be reduced from that achieved by the conventional method. The reason for this is believed to be as follows. In the conventional method, the growth promoting region, on which a GaN film is selectively grown, is exposed between adjacent stripes of the growth suppressing film. Therefore, at the initial stage, the nitride compound semiconductor crystal grows only between the adjacent stripes of the growth suppressing film, and the side surfaces of the growing nitride compound semiconductor layer are covered with the growth suppressing film. It is believed that a high density of crystal dislocation occurs at an interface between the growing nitride compound semiconductor film and the growth suppressing film, and extends in the nitride compound semiconductor crystal along the crystal growth direction (FIG. 7C). After the thickness of the grown crystal exceeds the thickness of the growth suppressing film, the crystal starts to grow laterally. Then, the threading dislocation generated from the interface between the side surface of the growth suppressing film and the nitride compound semiconductor crystal extends, while also spreading laterally, across the nitride compound semiconductor crystal, finally reaching the surface of the nitride compound semiconductor layer. As a result, a threading dislocation density as high as about $5\times10^7/cm^2$ will exist even in regions without the growth suppressing film. In addition, substantially the same threading dislocation density results in portions of the nitride compound semiconductor crystal which are grown laterally over the growth suppressing film. The threading dislocation continues to extend toward the crystal surface even after the laterally grown portions of the nitride compound semiconductor attach to each other into a single film (FIG. 7D). Therefore, a threading dislocation density as high as $5\times10^7/cm^2$ results on the surface of the nitride compound semiconductor layer formed according to the conventional method.

On the other hand, according to the present invention, the lateral growth of the crystal starts immediately after the nitride compound semiconductor layer starts to grow, and there is no growth suppressing film beside the growing nitride compound semiconductor crystal. This is believed to be the reason for the fact that a high threading dislocation density as that of the conventional method occurrs at the interface between side surfaces of the growth suppressing film and the growing nitride compound semiconductor crystal.

Hereinafter, specific examples of the present invention will be described.

EXAMPLE 1

Referring to FIGS. 1A to 1D, a nitride compound semiconductor film according to Example 1 of the present invention will be described. In the present example, zinc oxide (ZnO) as a compound is sputtered on a glass substrate, and a nitride compound semiconductor film is grown by MOCVD.

A glass substrate 101 having a diameter of about 2 inches is subjected to organic cleaning and etching by fluorine, and washed in deionized water for several minutes. Then, a ZnO film 102 is sputterred on the glass substrate 101. The ZnO film 102 may be provided by planar magnetron sputtering in a mixed gas (50% argon and 50% oxygen), under a pressure of about 0.05 Torr, with the power supplied from a high frequency power source being adjusted to about 200 W. The substrate 101 is heated to about 300° C. with a heater of a resistance heating type. The ZnO film 102 grown for about 30 minutes under the above conditions has a thickness of about 1 $\mu$m. The ZnO film 102 is partially etched by photolithography into a striped pattern with a width of about 4 $\mu$m and an interval of about 8 $\mu$m between the center of a stripe to the center of the next stripe. HCl diluted to about 10% is used as an etchant.

The glass substrate 101 having the striped ZnO film 102 which is formed by the method above is introduced into an MOCVD apparatus and a GaN film is formed therein. The film forming temperature of the MOCVD film may be about 1000° C. About 5 l/min of $NH_3$ as a V group material gas, about 100 $\mu$mol/min of trimethylgallium (TMG) as a III group material gas, and about 20 l/min of $H_2$ as a carrier gas are introduced into the apparatus. Under the above-described conditions, after about 1 hour, the grown GaN film has a thickness of about 6 $\mu$m. A length m of the GaN film 104 projecting from the sides of the growth promoting layer 102 is about 1.5 $\mu$m (FIG. 1B). As the crystal continues to grow from a state shown in FIG. 1B, the nitride compound semiconductor crystal further grows in the thickness direction as well as in the lateral direction. As a result, the selectively grown nitride compound semiconductor crystals attach to each other (FIG. 1C). Thereafter, the semiconductor crystal only grows in the vertical direction, thereby forming a nitride compound semiconductor layer 106 having a flat surface.

The threading dislocation density of GaN film 104 on the growth promoting layer 102 grown as described above is about $5\times10^9/cm^2$, which is lower than that of the conventional method. Moreover, the threading dislocation density of the laterally grown portion of the GaN film 104 is only about $3\times10^3/cm^2$, which is lower than that of the conventional method by about three orders of magnitude.

Figure 2:
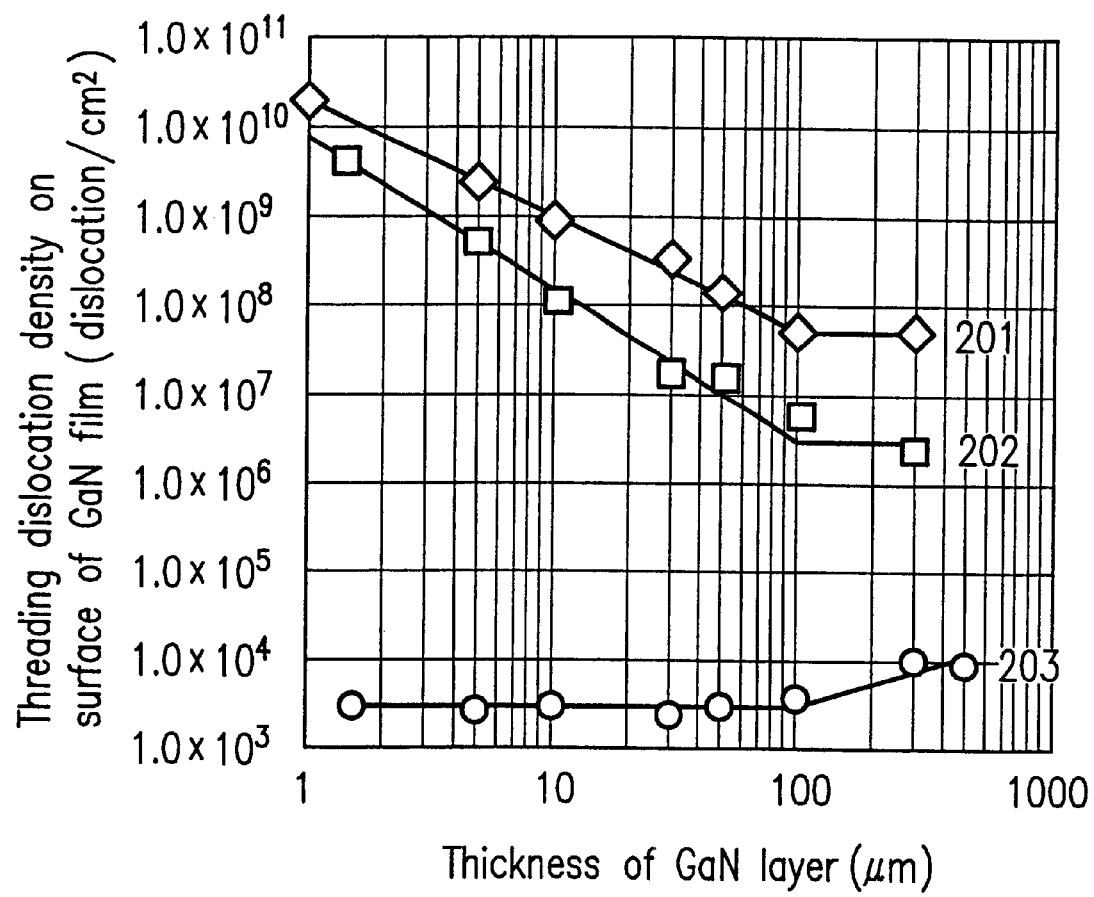
FIG. 2 is a graph showing a thickness dependency of the threading dislocation density of the thick GaN film according to Example 1 of the present invention.

Curves 202 and 203 in FIG. 2 show threading dislocation densities of GaN films of various thicknesses which are grown according to the method of the present invention over various growth times. Curves 202 and 203 correspond to a portion of a GaN film over the growth promoting film, and another portion of the GaN film over the growth suppressing film, respectively. Over the ZnO film as a growth promoting film, the threading dislocation density is smaller than that of the conventional method by about an order of magnitude. When the GaN film has a thickness of about 100 $\mu$m or more, the threading dislocation density is reduced to be as small as $4\times10^6/cm^2$. In a region with no ZnO film, that is, in a region over the glass substrate made of a growth suppressing film material, a dramatically small threading dislocation density of about $3-10\times10^3/cm^2$ is realized across the thickness of a continuous film (about 3 $\mu$m in this case). As described above, the threading dislocation density is reduced in all regions in comparison to that of the conventional method. In particular, in a region with no ZnO film, as the growth promoting film (i.e., in a region where the substrate as the growth suppressing film is exposed), a significant reduction in the threading dislocation density is realized.

In Example 1, a glass substrate is used as an amorphous substrate, but other substrates can be used, alternatively, such as a wafer in which amorphous Si is deposited to a thickness of about 1 $\mu$m on a Si substrate, or a wafer in which a $SiO_x$ film (x=1–2) or a $Si_2N_y$ film (y=2–3) with a thickness of about 0.2–2 $\mu$m is formed on a Si substrate. The selective growth of the nitride compound semiconductor from the ZnO film portion, and the effects associated therewith have been confirmed also with these alternative substrates. In such cases, the amorphous Si film, the $SiO_x$ film, and the $Si_2N_y$ film, function as the growth suppressing film for the nitride compound semiconductor.

EXAMPLE 2

Hereinafter, Example 2 of the present invention will be described where HVPE is used as a method for growing a GaN film, instead of the MOCVD used in Example 1.

A ZnO film is formed and a substrate is etched in a manner similar to that of Example 1, and the ZnO film is introduced into a HVPE apparatus to form a GaN film thereon. The HVPE film is formed at a temperature of about 1000° C., and with the following gases being introduced into the apparatus: about 1000 cc/min of $NH_3$ as a material gas of V group, about 20 cc/min of HCl which is passed along a molten Ga metal to supply a III-group material, and about 3000 cc/min of $H_2$ as a carrier gas. The temperature of the molten Ga metal is about 800° C. The growth rate of a GaN film under the conditions above is 100 μm/h in the direction perpendicular to the substrate.

The relationship between the thickness of the GaN film formed and the threading dislocation density on the surface of the GaN film has been examined for various growth times while maintaining the above-mentioned conditions. In a region over the ZnO film, when a thickness of the film is about 6 μm, the threading dislocation density is about $1 \times 10^9/cm^2$. When the thickness is increased to about 10 μm, the threading dislocation density is reduced to about $1 \times 10^8/cm^2$. When the thickness is further increased to about 20 μm, the threading dislocation density is reduced to about $3 \times 10^7/cm^2$. As the growth further continues for about 3 more hours, the GaN thick layer has a thickness of 300 μm, and the threading dislocation density on the surface of the thick film is about $8 \times 10^6/cm^2$. The threading dislocation density characteristic is substantially the same as that of curve 202 in FIG. 2, and the threading dislocation density of the GaN thick layer of the present example is smaller than that of the conventional method by an order of magnitude. Moreover, in a region with no ZnO film, i.e., in a region where the glass substrate is exposed, the threading dislocation density of the GaN film surface is substantially the same as that of curve 203 obtained in Example 1. It has thus been confirmed that HVPE as a method for growing the GaN film provides substantially the same effect as that provided by MOVCD.

No stripes and no irregularity which may possibly occur due to the stripe pattern of the ZnO film are observed on the surface of the thick GaN film provided according to Example 2 of the present invention, thereby providing a single, continuous, and flat film. In addition, a microscopic measurement has shown no cracks or pits on the film. As in Example 1, the cause of the reduction in threading dislocation density is believed to be the lateral growth of the GaN film from the sides of ZnO film (a growth promoting film) being promoted from the beginning of the growth process.

EXAMPLE 3

In Example 3, results obtained by changing the interval between adjacent stripes of the growth promoting film will be described. In a manner similar to that of Example 1, a ZnO film is sputtered over the glass substrate and then is etched by photolithography.

Samples are produced with the stripe width of the ZnO film (i.e., the width of the ZnO film which is not etched away but remains after the etching process) being fixed to about 5 μm, and with the stripe interval (i.e., the width of the ZnO film which is etched away between adjacent remaining stripes) being varied from about 1 μm, to about 2 μm, about 5 μm, about 10 μm, about 15 μm, about 20 μm, about 25 μm, and about 30 μm. The substrate is subjected to HVPE for 3 hours to grow a GaN film in a manner similar to that of Example 2. Herein, the thickness of the GaN film is about 300 μm irrespective of the other conditions.

The GaN film of all the above stripe intervals shows a constant threading dislocation density of about $7-10 \times 10^6/cm^2$ on a surface of the GaN film over the ZnO film region, and no crack is observed in any case. Thus, it is confirmed that for all the above stripe intervals, the threading dislocation density of the GaN film can be reduced from that of the conventional method by about an order of magnitude. A measurement of the threading dislocation density on the GaN film surface in a region where the glass substrate is exposed has shown that a wafer having a stripe interval of about 10 μm to 20 μm has a very small threading dislocation density as that represented by curve 203, but wafers having stripe intervals of about 25 μm and about 30 μm, respectively, have a region with a high, localized threading dislocation density of about $10^6/cm^2$ substantially along the center line of the etching width/cm. This is believed to occur as follows. When the etching width exceeds about 20 μm, the crystal axes of adjacent GaN crystals growing laterally toward each other are shifted by about 1° from each other, thereby resulting in the high threading dislocation density substantially along the center line of the etching width where the adjacent GaN crystals attach to each other.

Figure 3:
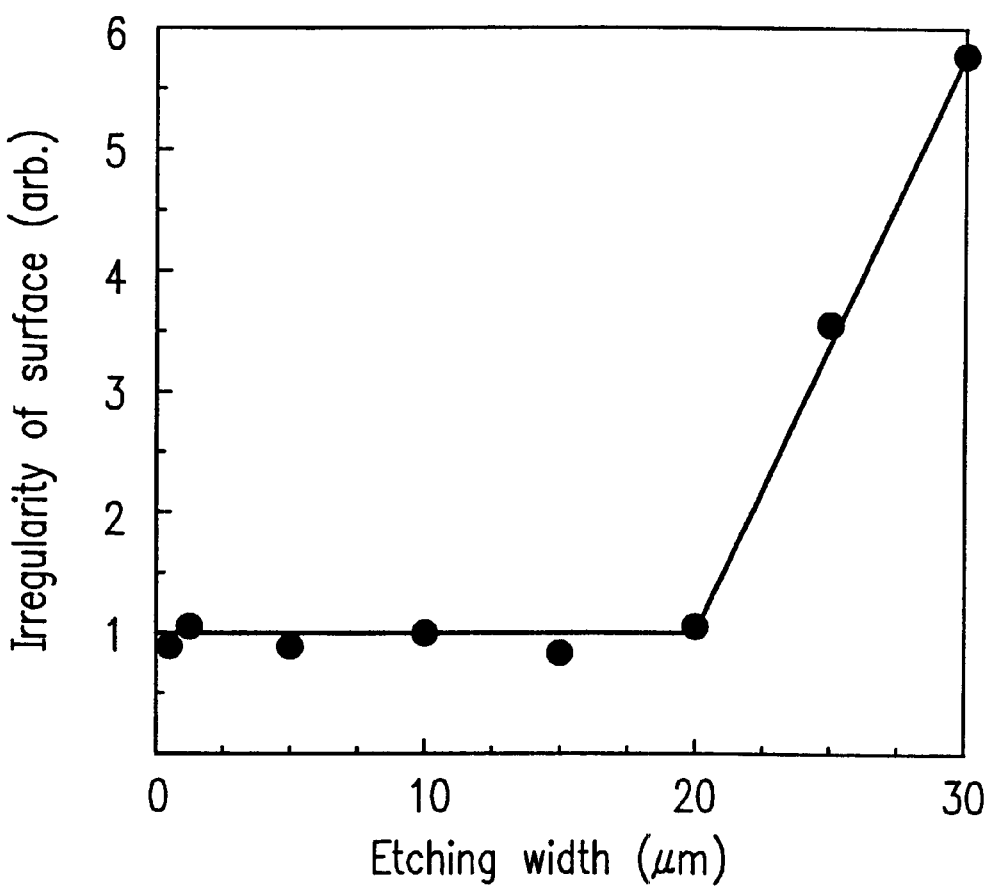
FIG. 3 is a graph illustrating changes in surface irregularity of a thick GaN film with respect to an etching width of a growth promoting film.

As a result of evaluating the regularity (i.e., flatness) of the GaN film surface, those films having a stripe width over about 20 μm have considerable irregularity along the center line of the etching width, because the adjacent laterally-growing crystals do not sufficiently attach to each other. FIG. 3 shows a relationship between an etching width and a surface regularity. In FIG. 3, the vertical axis represents the surface irregularity amplitude of various wafers normalized based on the surface irregularity amplitude of a GaN film having a thickness of about 300 μm which is obtained when the etching width of the ZnO film is about 10 μm. It has been shown that a substantially constant irregularity amplitude is obtained for etching widths of up to about 20 μm, but the irregularity amplitude is increased by about 4–6 fold when the etching width is about 25 μm or about 30 μm, thereby deteriorating the flatness of the surface. Therefore, when producing a light-emitting diode, it is important to set the etching width to about 20 μm or less.

Figure 4:
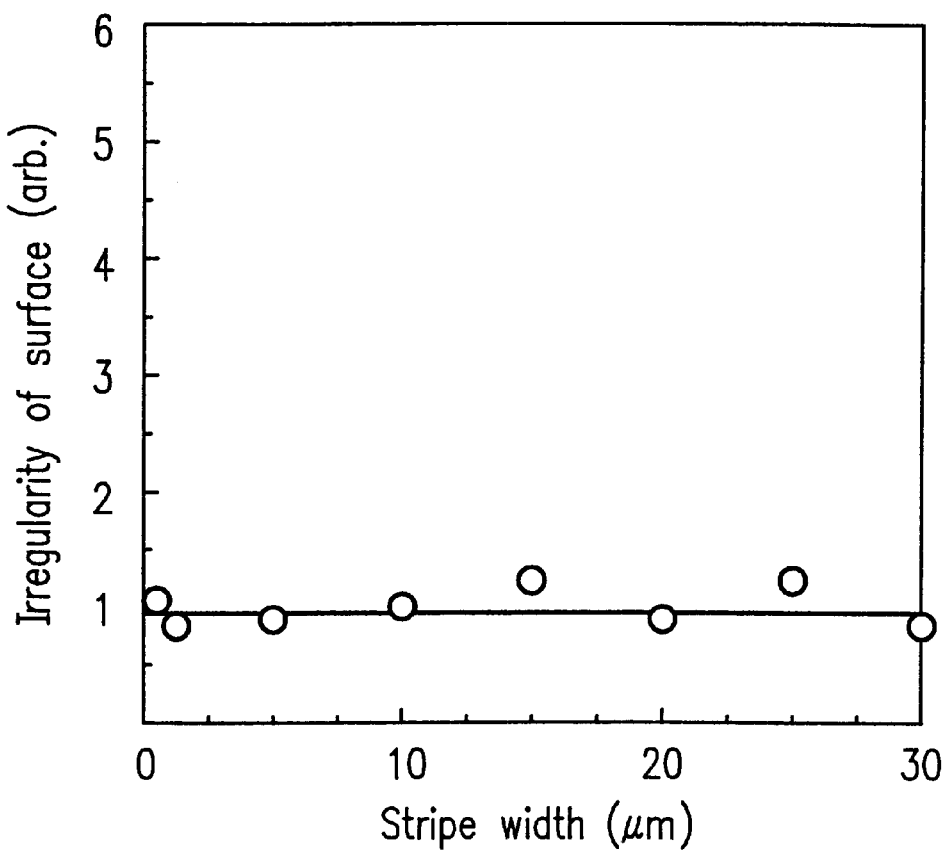
FIG. 4 is a graph illustrating changes in surface irregularity of a thick GaN film with respect to a stripe width of a growth promoting film.

In a manner similar to that of Example 2 of the present invention, various GaN films have been grown while varying the stripe width of the ZnO film from about 1 μm, to about 2 μm, about 5 μm, about 10 μm, about 15 μm, about 20 μm, about 25 μm, and about 30 μm and keeping etching width constant at about 5 μm. Each GaN film shows defect density characteristics similar to those shown in curve 202 and 203 (FIG. 2). FIG. 4 shows the irregularity amplitude on the surface of each of the GaN films which is normalized based on the irregularity amplitude of a wafer having a stripe width of about 10 μm. As can be seen from FIG. 4, the wafers of the various stripe widths have no significant difference in their surface irregularity.

EXAMPLE 4

In Example 4 of the present invention, a material for the growth promoting film is examined. A thick GaN film is grown by HVPE in a manner similar to that of Example 2, but GaN, AlN, InN, and a mixed crystal thereof grown at a low temperature are used as the growth promoting film instead of ZnO used in Example 1.

First, a case where GaN is used for the growth promoting film will be described. A thin GaN film having a thickness of about 0.5 μm is grown on a glass substrate by MOCVD. The growth temperature is about 600° C., $NH_3$ and TMG are used as material gases, and $H_2$ is used as a carrier gas. The thin GaN film formed in such a manner is subjected to a normal photolithography process and an etching process with hot nitric acid (about 200° C.), thereby partially removing a region of the thin GaN film with a width of about 10 µm, and leaving stripes of the thin GaN film each having a width of about 10 µm at a pitch of about 20 µm on the glass substrate. Thereafter, a thick GaN film having a thickness of about 20 µm is grown on the wafer formed as described above by HVPE in a manner similar to that of Example 2 of the present invention.

The threading dislocation density of the GaN thick layer is about $5 \times 10^7/cm^2$ in regions over the above-described thin GaN film in the form of stripes remaining on the glass substrate. Thus, it is possible to obtain the thick GaN film having substantially the same threading dislocation density as that obtained in the case where the ZnO film is used as the growth promoting film. A dislocation density characteristic substantially the same as that in the case of using ZnO (shown by curve 202 in FIG. 2) has been confirmed also when the thickness of the thick GaN film is varied. Also, the threading dislocation density of the thick GaN film surface in a region where the glass substrate is exposed is substantially the same as that obtained when ZnO is used as the growth promoting film (shown in curve 203).

When AlN, InN, or a mixed crystal of InGaAlN are used as a compound film, instead of the GaN film, the threading dislocation density on the thick GaN film surface with a thickness of about 20 µm is about $3-8 \times 10^7/cm^2$, thereby confirming an effect of reducing the threading dislocation density which is substantially the same as that obtained when the GaN film is used.

In the present example, a glass substrate is used as an amorphous substrate, but any other substrate is applicable as long as it has a high heat resistance such that the substrate can withstand the GaN growth process. It is especially effective to provide a certain crystalline seed in a substrate so that the crystal orientation of the compound film to be formed on the substrate is aligned in a certain direction, or to employ a graphoepitaxial method so as to scratch the substrate in a certain direction. The glass substrate used in the present example has shallow grooves (depth: about 10 nm to about 300 nm) etched on the surface thereof in a stripe pattern having an interval of about 0.5 µm.

As the amorphous substrate, any of the following substrates may be used instead of the glass substrate as described above: a substrate having a $SiO_x$ (x=1–2) film having a thickness in the range of about 0.5 µm to about 2 µm deposited by a thermal oxidation method or a CVD method on any of a Si wafer, a sapphire wafer, and a GaAs wafer; a substrate having a $SiN_y$ (y=1–3) film having a thickness in the range of about 0.5 µm to about 2 µm deposited by a plasma CVD method on any of the above-mentioned wafers; and a substrate having an amorphous Si film having a thickness in the range of about 0.5 µm to about 5 µm deposited on any of the above-mentioned wafers. It has been confirmed that each of the above-listed substrates functions as a growth suppressing film as the glass substrate, and provides an effect of reducing the threading dislocation density which is substantially the same as those shown by curves 202 and 203 (FIG. 2).

Moreover, GaN films have been formed according to the steps of Example 1 on ZnO growth promoting films of various thicknesses of about 0.1 µm, about 0.2 µm, about 2 µm, about 3 µm, and about 5 µm, rather than about 1 µm as in Examples 1 to 4. It has been confirmed that a reduced threading dislocation density on the surface of the thick GaN film as those shown by curves 202 and 203 can be obtained when the thickness of the growth promoting film is about 0.2 µm or more. However, in the case where the growth promoting film has a thickness of about 0.1 µm, the threading dislocation density is similar to or higher than that shown by 201 of the GaN film obtained by the conventional method. This can be understood from the fact that the lateral growth of the crystal from the sides of the growth promoting film has a significant influence on the effect of reducing the threading dislocation density of the present invention, and that the area of the side of the growth promoting film (ZnO film) is proportional to the thickness thereof. Accordingly, it is understood that the thickness of the growth promoting film of the present invention should be equal to or greater than about 0.2 µm. Moreover, as the thickness of the growth promoting film is increased, the threading dislocation density can be reduced more, but it will then become necessary to increase the GaN crystal growth time in order to obtain a flat thick GaN film. Accordingly, it is preferred to set the thickness of the growth promoting film to about 3 µm or less.

EXAMPLE 5

In Example 5, a case where a Si substrate is used as a non-amorphous substrate (crystalline substrate) which functions as a growth suppressing film will be described. A Si substrate is washed for a few minutes with a mixed solution of sulfuric acid and hydrogen peroxide. Then the Si substrate is subjected to a soft etching process with diluted hydrogen fluoride, and a striped ZnO film is formed as in the above-described examples. Then, a GaN film is grown thereon. The GaN film is grown on several types of substrates having particular orientations, respectively. For any of the substrates, the GaN film can be easily grown on the striped ZnO film.

When the Si substrate having a surface along a (100) or (110) orientation, the threading dislocation density on the surface of the GaN film in a region directly above the ZnO film is substantially the same as that shown by curve 202. In any region where the Si substrate is exposed (i.e., where the ZnO film is etched away), the threading dislocation density is about $1 \times 10^4/cm^2$, which is lower than that of the conventional method, as in Examples 1 to 4 which use an amorphous substrate.

In the present example, the Si substrate having a surface along a (100) or (110) orientation is used as the growth suppressing film. However, also when a substrate having a cubic crystal structure, such as GaP, GaAs, or the like, having a surface along a (100) or (110) orientation is used, a function as the growth suppressing film for a GaN film can be obtained, and a good GaN film can be obtained which has a threading dislocation density smaller than that of the conventional method by an order of magnitude or more.

Comparative Example 1

Figure 5:
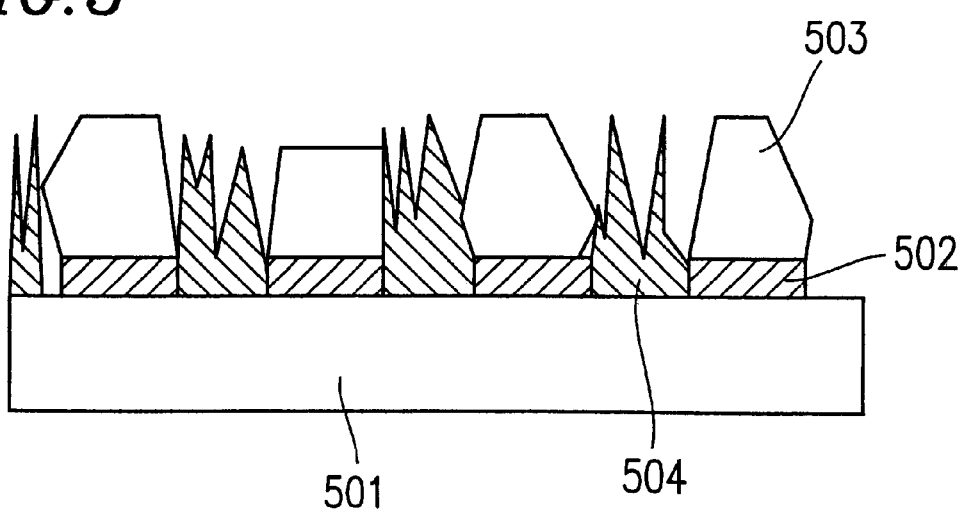
FIG. 5 illustrates a structure of a thick GaN film when a Si substrate having a surface along a (111) orientation is used according to a comparative example.

In this comparative example, a thick GaN film is grown in a manner similar to Example 5 by using a Si substrate having a surface along a (111) orientation. As shown in FIG. 5, the thick GaN film having a single flat surface cannot be obtained because a GaN crystal is deposited in a region where the (111) oriented Si substrate is exposed at the same time when the lateral growth of a crystal starts to occur (at the beginning of the growth process) from the sides of the growth promoting film. Reference numeral 501 denotes a Si substrate having a surface along a (111) orientation; 502 denotes a ZnO film as a growth promoting film; 503 denotes a GaN crystal selectively growing upwardly from the ZnO film 502; and 504 denotes multi-crystalline GaN growing directly from the (111) oriented Si substrate 501.

As illustrated in FIG. 5, the Si substrate 501 of a (111) orientation does not function as the growth suppressing film, and thus a single crystal thick GaN film cannot be obtained. Moreover, because of the multi-crystalline GaN 504, the lateral growth from the sides of the growth promoting film is inhibited. As a result, the threading dislocation density in the vicinity of the surface of the GaN film formed partially on the growth promoting film 502 is very high (on the order of about $10^9/cm^2$) irrespective of the thickness of the GaN film. Thus, a GaN film of an excellent quality cannot be obtained.

Example 5 and Comparative Example 1 will be compared with each other in terms of the dependency of the threading dislocation density of the thick GaN film in a region directly above the growth promoting film on the surface orientation of the substrate used as a growth suppressing film, for a GaN film thickness of about 100 μm. When a Si substrate having a surface orientation of (100) or (110) is used, the threading dislocation density is about $4 \times 10^6/cm^2$. On the other hand, when a Si substrate of a (111) surface orientation is used, the threading dislocation density is about $3 \times 10^9 cm^2$. As is evident from the above, when the Si substrate is used, it is important to select a surface orientation of (100) or (110) in order to reduce the threading dislocation density of the thick GaN film.

When a GaN thick layer is formed by the steps as those of Example 5 on a GaAs substrate or a GaP substrate having a (111) orientation, the formation will be as illustrated in FIG. 5, and a continuous, single GaN film cannot be obtained. It is thus shown that it is preferred to use a substrate having a surface along a (100) orientation or a (110) orientation when a crystalline substrate is used as a growth suppressing film.

Although formation of a GaN film as a nitride compound semiconductor film has been described in the examples above, the present invention is also applicable to formation of a semiconductor film other than a GaN film, e.g., a film of a nitride containing aluminum or indium as a III group element, and a film of a compound in which the nitride element is partially substituted with another V group element (e.g., P, As, and the like).

EXAMPLE 6

Figure 6:
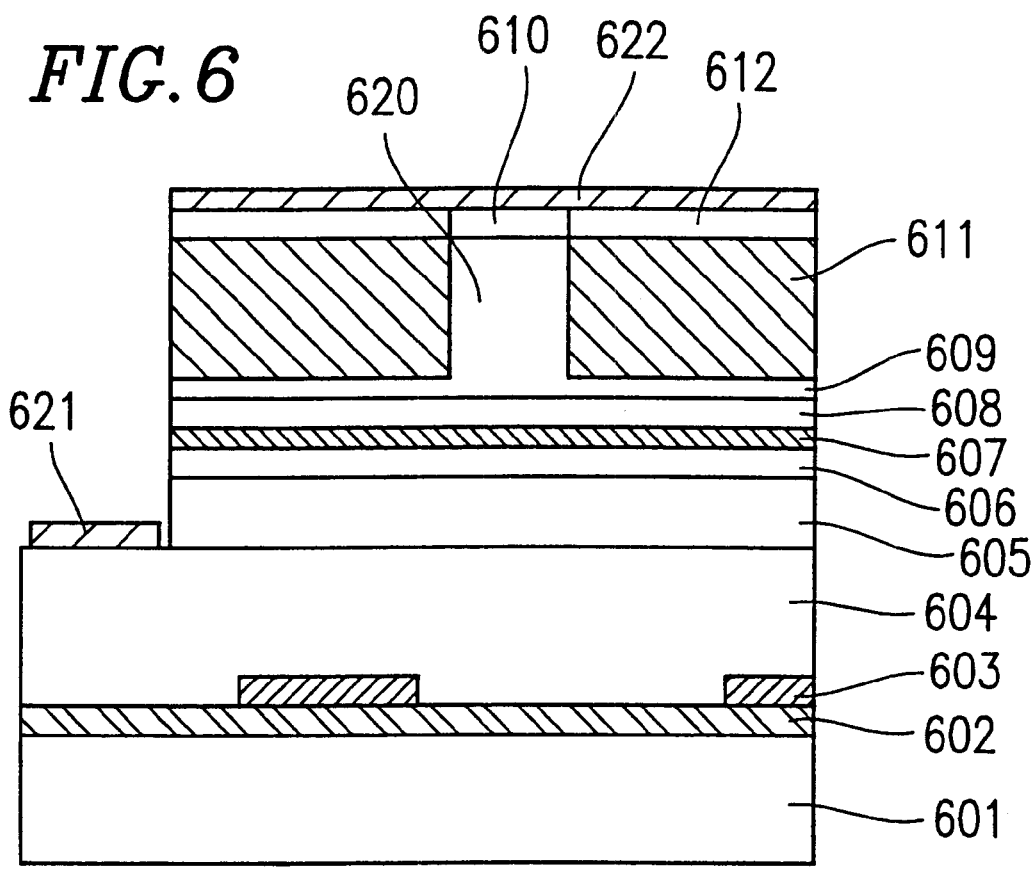
FIG. 6 is a cross-sectional view illustrating a structure of a semiconductor laser device according to Example 6 of the present invention.

A method for manufacturing a light-emitting diode according to the present invention will now be described. A light-emitting diode in the present example is a semiconductor laser device. FIG. 6 shows a cross-sectional view thereof.

The wafer used in this example is provided with a silicon oxide ($SiO_x$) film 602 having a thickness of about 2 μm formed by thermal oxidation on a Si substrate 601. Deposited on the wafer are: a striped AlN growth promoting film 603 (width: about 3 μm, thickness: about 0.8 μm); an n-type thick GaN film 604 (thickness: about 15 μm); an n-type $Al_{0.08}Ga_{0.92}N$ cladding layer 605; an n-type GaN guide layer 606; a multiple quantum well active layer 607 including two $In_{0.15}Ga_{0.85}N$ well layers each having a thickness of about 2 nm and three $In_{0.05}Ga_{0.95}N$ barrier layers each having a thickness of about 3 nm; a p-type GaN guide layer 608; a p-type $Al_{0.08}Ga_{0.92}N$ cladding layer 609 having a mesa stripe structure having width of about 2 μm; a p-type GaN contact layer 610; an n-type $Al_{0.1}Ga_{0.9}N$ current constriction layer 611; a p-type buried layer 612; an n-side electrode 621; and a p-side electrode 622. Crystal growth of these layers can be achieved by MOCVD.

In the semiconductor laser device of this example, a current is injected into, and light is emitted from, a portion of the active layer 607 located below the mesa stripe 620. The light emitting portion is arranged above a region where the $SiO_x$ film 602 is exposed after the growth promoting film 603 is partially removed. This is because the threading dislocation density of the GaN thick layer 604 is lower and the crystallinity is better in a region with no growth promoting film 603, as can be seen from a comparison between curves 202 and 203 in FIG. 2. A reliability evaluation of the device according to the present example has shown a threshold current of about 35 mA and a differential emission efficiency of about 0.7 W/A, indicating a high efficiency emission characteristic at a low current. A good reliability has been confirmed, lasting for about 5000 hours or more, under conditions of an atmospheric temperature of about 60° C. and an optical output of about 5 mW.

A measurement of the characteristics of the device obtained in the case where the mesa stripe 620 is formed above the AlN growth promoting film 602 has shown a threshold voltage of about 57 mA, and a differential emission efficiency of about 0.5 W/A, indicating an increase in the threshold current and a decrease in the emission efficiency. However, a test under the conditions as described above has shown that the operating life of the device is about 3500 hours, which is still significantly better than that obtained by the conventional method (see Comparative Example 2 below). Such an improvement in the operating life of the device is obtained by the effect of reducing the threading dislocation density which is provided by the present invention (as can be seen from a comparison between curves 201 and 202 in FIG. 2).

Comparative Example 2

As a comparison with Example 6, a device has been produced by providing a structure corresponding to a part of the structure of Example 6 including the n-type AlGaN cladding layer 605 and other layers thereabove, on the GaN thick layer 705 which is produced by the conventional method described above with reference to FIGS. 7A–7D. A measurement of the characteristics of the device in this comparative example has shown a threshold current equal to or greater than about 80 mA, and a differential emission efficiency less than or equal to about 0.3 W/A, indicating a higher threshold current and a lower efficiency than those of the device of Example 6, irrespective of the location of the mesa stripe 620. An operating life test under the same conditions as those of Example 6 has shown that the device of this comparative example has a short operating life of about 250 hours or less, indicating that the device will have a significant problem in practical use.

According to the present invention, crystal growth of an excellent nitride compound semiconductor with low threading dislocation density can be provided: (1) by using a substrate (growth suppressing film) on which the epitaxial growth of the nitride compound semiconductor is difficult to occur; (2) by selectively covering a number of locations of the substrate with a growth promoting film (where initial growth of the nitride compound semiconductor easily occurs) in the form of stripes each having a width of about 100 μm or less; and (3) by epitaxially growing the nitride compound semiconductor on the substrate, thereby promoting the lateral growth of the crystal from the sides of the growth promoting film. By growing a thick film having a thickness of about 100 μm or more by the method of the present invention, it is possible to grow a nitride compound semiconductor film having a further reduced threading dislocation density with no cracks.

Furthermore, it is possible to provide a nitride compound semiconductor with a further reduced threading dislocation density by utilizing the process in which a nitride compound semiconductor crystal grows horizontally to the substrate and allowing nitride compound semiconductor crystals from adjacent growth promoting films to attach to each other. When the horizontal crystal growth process is utilized, a compound film is preferably provided in a stripe pattern on the substrate with a stripe interval of about 20 μm or less, so that the adjacent crystals are well attached to each other, thereby providing a nitride compound semiconductor having reduced threading dislocation density and irregularity.

Moreover, when a semiconductor laser device is produced on the nitride compound semiconductor of the present invention, it is possible to achieve excellent characteristics such as a lower threshold current, a higher emission efficiency, and a longer operating life. In addition, when a light-emitting region of the semiconductor laser, into which a current is injected, is provided above a region with no growth promoting film, the operating life of device can be further improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a nitride compound semiconductor light-emitting device, the method comprising the steps of:
   providing a substrate having a portion which acts as a growth suppressing film on a top surface thereof;
   forming a growth promoting film partially on the substrate; and
   forming a nitride compound semiconductor layered structure including a light-emitting layer formed on the substrate, the light emitting layer having a light-emitting region into which an electric current is injected,
   wherein the nitride compound semiconductor crystal is grown starting from the growth promoting film to cover the substrate upon uniting with films having been grown.

2. A method for producing a nitride compound semiconductor light-emitting device according to claim 1, wherein the substrate is an amorphous film or cubic crystal structure having a surface along a (110) orientation or a (100) orientation, and the growth promoting film is ZnO or $In_sGa_wAl_{1-s-w}N$ ($0 \leq s \leq 1$, $0 \leq w \leq 1$, $0 \leq s+w \leq 1$).

3. A method for producing a nitride compound semiconductor light-emitting device according to claim 1, wherein a thickness of the growth promoting film is equal to or greater than about 0.2 μm.

4. A method for producing a nitride compound semiconductor light-emitting device according to claim 1, wherein the growth promoting film is in a form of a plurality of stripes separated from one another by an interval of about 20 μm or less.

5. A method for producing a nitride compound semiconductor light-emitting device according to claim 1, wherein the light emitting region is formed above a region of the substrate where no growth promoting film is formed.

6. A method for producing a nitride compound semiconductor light-emitting device according to claim 1, further comprising a step of removing the substrate, growth suppressing film and growth promoting film from the nitride compound semiconductor light emitting device.

7. A method for producing a nitride compound semiconductor light-emitting device according to claim 1, wherein a width of the growth promoting film is about 100 μm or less.

8. A method for producing a nitride compound semiconductor light-emitting device according to claim 1, wherein vertical and lateral growth of the nitride compound semiconductor layered structure from the growth promoting film provides a substantially flat top surface of the bottom most layer of the nitride compound semiconductor layered structure.

9. A method for producing a nitride compound semiconductor light-emitting device comprising the steps of:
   forming a growth promoting film partially on the substrate; and
   forming a nitride compound semiconductor layered structure including a light-emitting layer on the substrate and growth promoting film, such that a top surface of a bottom most layer of a GaN film is substantially flat, the light emitting layer having a light-emitting region into which an electric current is injected;
   wherein the nitride compound semiconductor crystal is grown starting from the growth promoting film to cover the substrate upon uniting with films having been grown.

10. A method for producing a nitride compound semiconductor light-emitting device according to claim 9, wherein the substrate is an amorphous film or cubic crystal structure having a surface along a (110) orientation or a (100) orientation, and the growth promoting film is ZnO or $In_sGa_wAl_{1-s-w}N$ ($0 \leq s \leq 1$, $0 \leq w \leq 1$, $0 \leq s+w \leq 1$).

11. A method for producing a nitride compound semiconductor light-emitting device comprising the steps of:
   providing a substrate having a portion which acts as a growth suppressing film on a top surface thereof;
   forming a growth promoting film on the substrate;
   removing portions of the growth promoting film to form stripes of growth promoting film having an interval therebetween which provides enhanced lateral growth of a subsequent layer formed thereon; and
   forming a nitride compound semiconductor layered structure including a light-emitting layer on the substrate and growth promoting film, the light emitting layer having a light-emitting region into which an electric current is injected;
   wherein the nitride compound semiconductor crystal is grown starting from the growth promoting film to cover the substrate upon uniting with films having been grown.

12. A method for producing a nitride compound semiconductor light-emitting device according to claim 11, wherein the substrate is an amorphous film or cubic crystal structure having a surface along a (110) orientation or a (100) orientation, and the growth promoting film is ZnO or $In_sGa_wAl_{1-s-w}N$ ($0 \leq s \leq 1$, $0 \leq w \leq 1$, $0 \leq s+w \leq 1$).

13. A method for producing a nitride compound semiconductor light-emitting device according to claim 11, wherein the interval between the growth promoting stripes is about 20 μm or less.

14. A method for producing a nitride compound semiconductor light-emitting device according to claim 1, wherein the nitride compound semiconductor is grown in a layer direction and lateral direction from the growth promoting film.

15. A method for producing a nitride compound semiconductor light-emitting device according to claim 1, Wherein the growth promoting film is $In_sGa_wAl_{1-s-w}N$ ($0 \leq s \leq 1$, $0 \leq w \leq 1$, $0 \leq s+w \leq 1$).

16. A method for producing a nitride compound semiconductor light-emitting device according to claim 1, wherein after growing the growth promoting film, at the temperature of about 1000° C., an initial epitaxial growth is provided in contacting with the growth promoting film.

17. A method for producing a nitride compound semiconductor light-emitting device according to claim 16, wherein the substrate is an amorphous film or cubic crystal structure having a surface along a (110) orientation or a (100) orientation, and the growth promoting film is ZnO or $In_sGa_wAl_{1-s-w}N$ ($0 \leq s \leq 1$, $0 \leq s \leq 1$, $0 \leq s+w \leq 1$).

18. A method for producing a nitride compound semiconductor light-emitting device according to claim 11, wherein the growth promoting film is $In_sGa_wAl_{1-s-w}N$ ($0 \leq s \leq 1$, $0 \leq w \leq 1$, $0 \leq s+w \leq 1$).

19. A method for producing a nitride compound semiconductor light-emitting device according to claim 11, wherein after growing the growth promoting film, at the temperature of about 1000° C., an initial epitaxial growth is provided in contacting with the growth promoting film.

* * * * *